United States Patent
Miyashita

(10) Patent No.: US 8,390,375 B2
(45) Date of Patent: Mar. 5, 2013

(54) CALCULATING APPARATUS, DISTORTION CORRECTING APPARATUS, AMPLIFYING APPARATUS, AND CALCULATING METHOD

(75) Inventor: Takumi Miyashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 121 days.

(21) Appl. No.: 13/018,741

(22) Filed: Feb. 1, 2011

(65) Prior Publication Data

US 2011/0204975 A1    Aug. 25, 2011

(30) Foreign Application Priority Data

Feb. 25, 2010   (JP) .................................. 2010-040141

(51) Int. Cl.
*H03F 1/26* (2006.01)
(52) U.S. Cl. ..................... 330/149; 330/285; 455/114.3; 375/296; 375/297
(58) Field of Classification Search .................. 330/149; 375/296–297; 455/114.3
See application file for complete search history.

(56) References Cited

U.S. PATENT DOCUMENTS

| 6,118,335 | A | * | 9/2000 | Nielsen et al. ..................... 330/2 |
| 6,288,610 | B1 | | 9/2001 | Miyashita |

FOREIGN PATENT DOCUMENTS

| EP | 1914885 A1 | 4/2008 |
| JP | 2004-186258 A | 7/2004 |
| JP | 2006-227847 A | 8/2006 |
| JP | 2006-295992 A | 10/2006 |

OTHER PUBLICATIONS

Extended European Search Report dated Oct. 31, 2011 for corresponding European Application No. 11154795.6.

* cited by examiner

*Primary Examiner* — Robert Pascal
*Assistant Examiner* — Khiem Nguyen
(74) *Attorney, Agent, or Firm* — Fujitsu Patent Center

(57) ABSTRACT

A calculating apparatus includes a first state variable calculating unit that calculates first state variables respectively having a memory effect and being of an amplifier that causes signal distortion; an amplifier model unit that based on the calculated first state variables, calculates the signal distortion caused by the amplifier, as a distortion characteristic; and an output unit that outputs the calculated distortion characteristic.

14 Claims, 10 Drawing Sheets

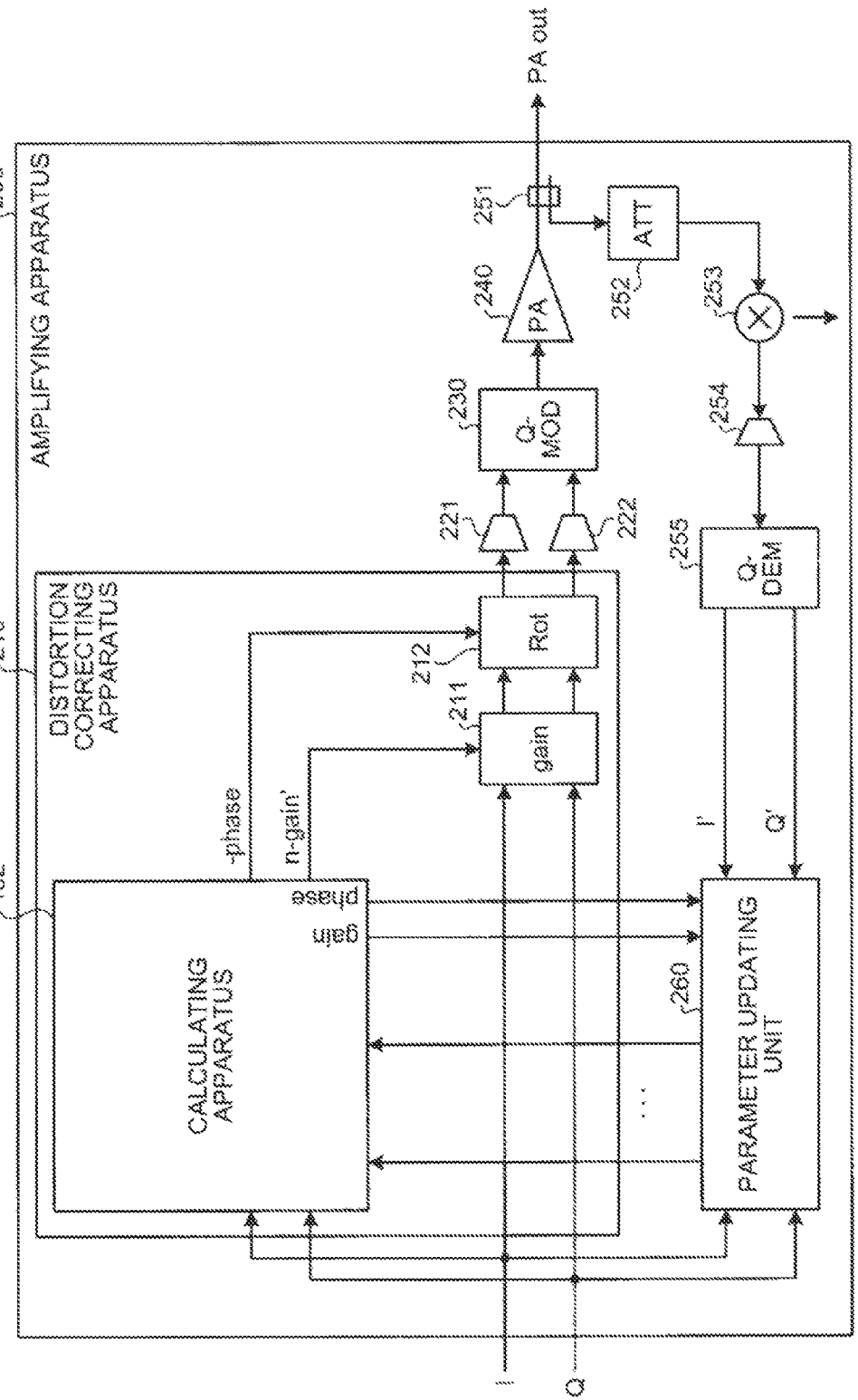

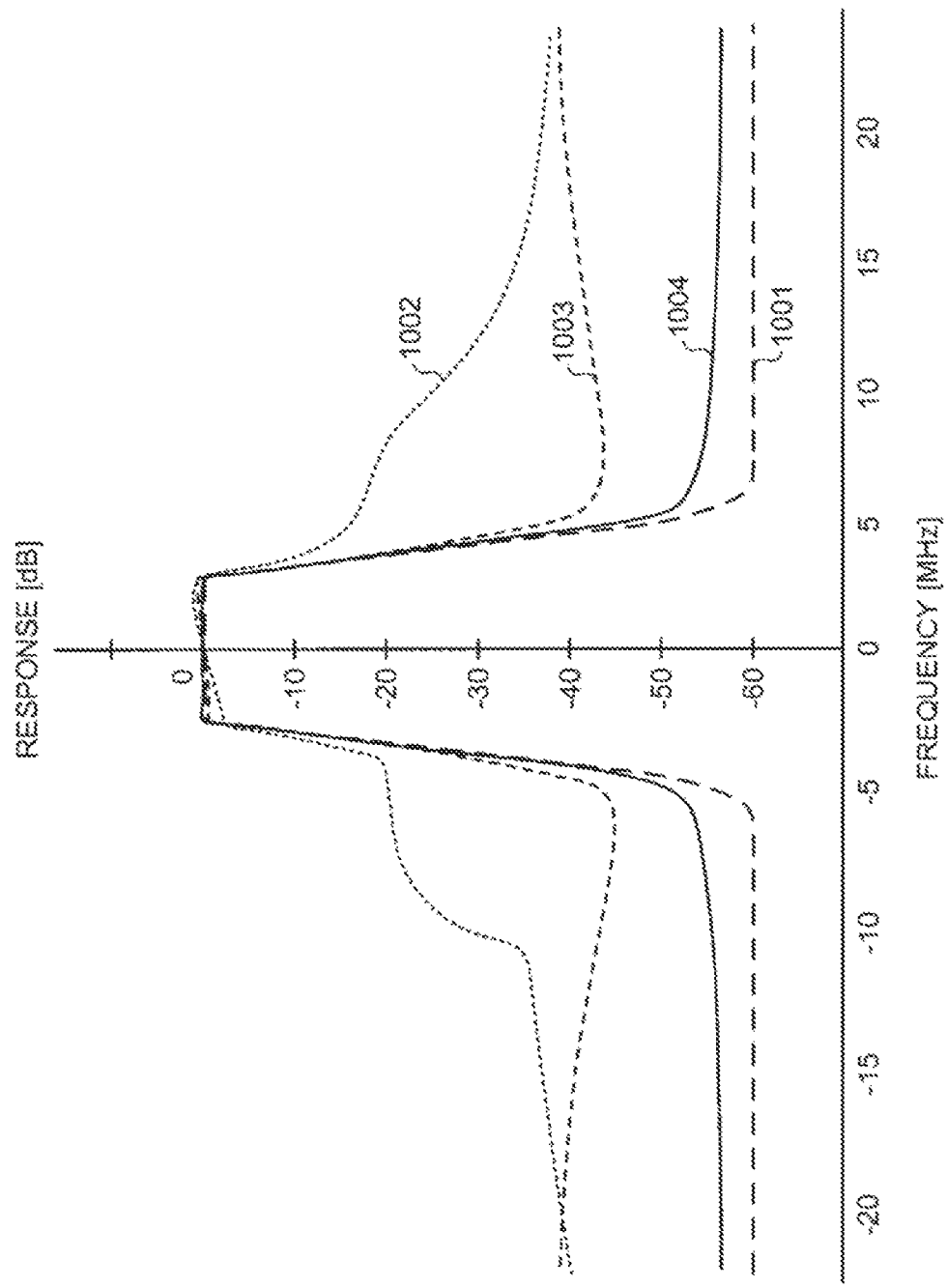

CALCULATING APPARATUS, DISTORTION CORRECTING APPARATUS, AMPLIFYING APPARATUS, AND CALCULATING METHOD

CROSS REFERENCE TO RELATED APPLICATIONS

This application is based upon and claims the benefit of priority of the prior Japanese Patent Application No. 2010-040141, filed on Feb. 25, 2010, the entire contents of which are incorporated herein by reference.

FIELD

The embodiment discussed herein is related to calculation of signal distortion caused by an amplifier.

BACKGROUND

A radio frequency (RF) signal transmission facility such as a base station or a mobile station in wireless communication employs a digital pre-distorter (DPD) that executes a process of correcting signal distortion at a digital level (see, e.g., Japanese Laid-Open Patent Publication No. 2006-295992). Recently wideband communication such as that employing wideband code division multiple access (W-CDMA) or orthogonal frequency division multiplexing (OFDM) has been become prevalent.

With the spread of wideband communication, the correction of memory effect of distortion characteristics of a power amplifier (PA) is desirable. Types of general-purpose distortion models that express the distortion characteristics of the power amplifier include a type of model that combines expressions of the memory effect. For example, assuming that a time interval is represented by "$\Delta$", a general-purpose distortion model that expresses a distortion characteristic of a power amplifier is expressed as equation (1) below using a memory polynomial expression (the quadratic term of the Volterra series).

$$v_0(t) = \sum_k \sum_n a_{k,n} v_{in}^n(t - k\Delta) \quad (1)$$

In equation (1), "vo(t)" represents distortion of a signal amplified by the power amplifier. "t" represents time. "ak, n" represents a coefficient for each amplifier-related factor causing distortion of the signal. "vin" represents the signal before amplification by the power amplifier. "t−k$\Delta$" represents the memory effect of the power amplifier.

However, in the conventional technique, use of a higher-order series is desired in the model expressing the distortion characteristics of the amplifier. Therefore, a tremendous number of combinations of memory effects and distortion properties must be calculated to generate a correction signal, arising in a problem of a tremendous amount of calculation. Especially, in a modulation scheme whose peak power is large relative to its average power such as W-CDMA or OFDM, the memory effect of the distortion characteristics is significant and the amount of the calculation becomes even more significant. Therefore, calculation of the distortion characteristics of the amplifier consumes a great deal of time and the convergence of the correction signal is degraded. Power consumption also becomes tremendous because the amount of calculation becomes tremendous.

If the order of the model is reduced to reduce the amount of calculation, the memory effect of the amplifier is not sufficiently reflected on the correction coefficient. Therefore, a problem arises in that the signal distortion caused by an amplifier that has a memory effect can not be corrected accurately.

SUMMARY

According to an aspect of an embodiment, a calculating apparatus includes a first state variable calculating unit that calculates first state variables respectively having a memory effect and being of an amplifier that causes signal distortion; an amplifier model unit that based on the calculated first state variables, calculates the signal distortion caused by the amplifier, as distortion characteristics; and an output unit that outputs the calculated distortion characteristics.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a block diagram of an exemplary configuration of an amplifying apparatus and a distortion correcting apparatus according to the embodiment.

FIG. 10 is a figure depicting distortion correction of a signal by the distortion correcting apparatus.

DESCRIPTION OF EMBODIMENTS

Preferred embodiments of the present invention will be explained with reference to the accompanying drawings. According to the technique disclosed herein, multiple state variables of an amplifier that has a memory effect are calculated and signal distortion caused by the amplifier is calculated based on the calculated state variables, whereby the amount of calculation is reduced for calculating the distortion characteristics of the amplifier.

Figure 1A:
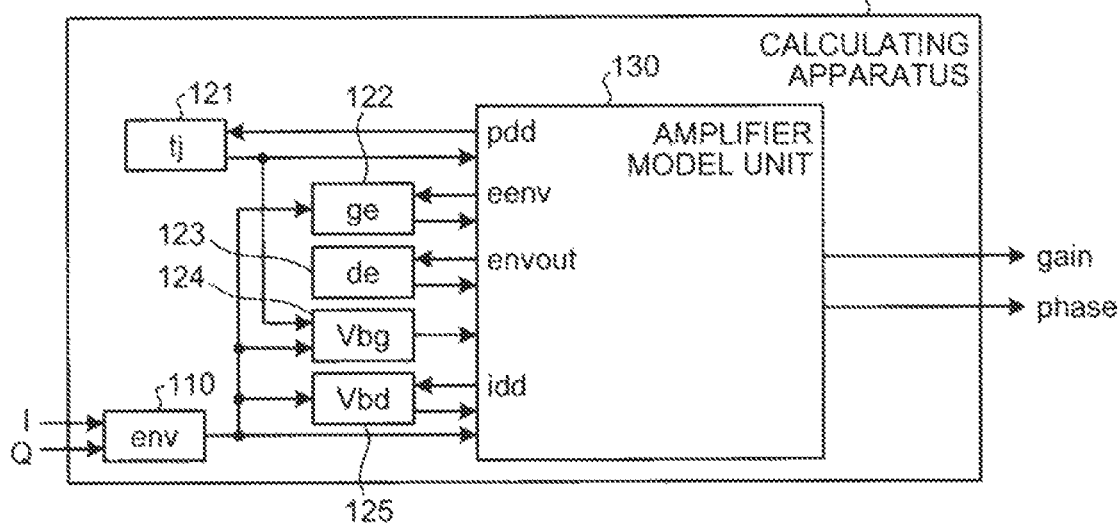
FIG. 1A is a block diagram of a first exemplary configuration of a calculating apparatus according to an embodiment.

FIG. 1A is a block diagram of a first exemplary configuration of a calculating apparatus according to an embodiment. The calculating apparatus 101 depicted in FIG. 1A is a calculating apparatus that calculates an estimated value of signal distortion caused by an amplifier (such as, for example, a microwave power amplifier 240 of FIG. 2). The calculating apparatus 101 includes an envelope signal generating unit 110, an estimated temperature calculating unit 121, a gate lag model calculating unit 122, a drain lag model calculating unit 123, a gate bias voltage model calculating unit 124, a drain bias voltage model calculating unit 125, and an amplifier model unit 130.

A microwave power amplifier has multiple state variables (factors) that cause linear or non-linear distortion of a signal amplified thereby. The state variables that cause distortion of the signal include state variables that have a memory effect and state variables that have no memory effect. "Memory effect" refers to a phenomenon where an input/output property varies according to the history of previous amplified signals.

The state variables that have a memory effect include, for example, the temperature of the microwave power amplifier (a thermal memory effect); and a gate lag, a drain lag, a gate (base) bias voltage, and a drain (collector) bias voltage of a transistor in the microwave power amplifier. When these state variables vary, the electronic property of the semiconductor varies, whereby signal distortion caused by the microwave power amplifier changes.

The temperature of the microwave power amplifier refers to an increase in the device temperature due to self-heating and variation of the device temperature due to the heat dissipation through a semiconductor substrate, a package, a wiring board, and a housing. The gate lag and the drain lag are caused by trap and release of charges by/from charge traps of the semiconductor due to temporal fluctuation of gate voltage and drain voltage of the transistor of the microwave power amplifier.

Gate current in the transistor of the microwave power amplifier varies according to an RF envelope, whereby the gate (base) bias voltage is caused. The history of the gate current variation is accumulated in a bias circuit and this accumulation causes the bias voltage to vary in complicated manner. As a result, memory distortion of the microwave power amplifier is caused.

Drain (collector) current in the transistor of the microwave power amplifier varies according to the RF envelope, whereby the drain (collector) bias voltage is caused. The history of the variation of the drain current is accumulated in a bias circuit and this accumulation causes the bias voltage to vary in complicated manner. As a result, memory effect of a microwave power amplifier is caused.

The envelope signal generating unit 110 receives input of signals (I, Q) of "I-ch" and "Q-ch" which are quadrature modulated to be the input into microwave amplifier. The envelope signal generating unit 110 generates an envelope env of the signal input thereto, and outputs the generated envelop env to the gate lag model calculating unit 122, the gate bias voltage model calculating unit 124, the drain bias voltage model calculating unit 125, and the amplifier model unit 130.

The estimated temperature calculating unit 121, the gate lag model calculating unit 122, the drain lag model calculating unit 123, the gate bias voltage model calculating unit 124, and the drain bias voltage model calculating unit 125 are state variable calculating units. The state variable calculating units calculate each state variable of the microwave power amplifier which causes a signal distortion having memory effect.

More specifically, the estimated temperature calculating unit 121 calculates a junction temperature "tj" of the microwave power amplifier based on a power consumption "pdd" output from the amplifier model unit 130. The estimated temperature calculating unit 121 outputs the calculated junction temperature tj to the gate bias voltage model calculating unit 124 and the amplifier model unit 130, as a state variable of the microwave power amplifier.

The gate lag model calculating unit 122 calculates a gate lag signal "ge" that represents the gate lag of the microwave power amplifier, based on an effective envelope "eenv" output from the amplifier model unit 130. The gate lag model calculating unit 122 may also calculate the gate lag signal ge of the microwave power amplifier, based on the envelope env output from the envelope signal generating unit 110. The gate lag model calculating unit 122 outputs the calculated gate lag signal ge to the amplifier model unit 130, as a state variable of the microwave power amplifier.

The drain lag model calculating unit 123 calculates a drain lag signal "de" that represents the drain lag of the microwave power amplifier, based on an output envelope "envout" output from the amplifier model unit 130. The drain lag model calculating unit 123 outputs the calculated drain lag signal de to the amplifier model unit 130, as a state variable of the microwave power amplifier.

The gate bias voltage model calculating unit 124 calculates a gate bias voltage "Vbg" of the microwave power amplifier, based on the junction temperature tj output from the estimated temperature calculating unit 121 and the envelop env output from the envelope signal generating unit 110. The gate bias voltage model calculating unit 124 may also calculate the gate bias voltage Vbg taking into consideration a drain bias voltage "Vbd" calculated by the drain bias voltage model calculating unit 125. The gate bias voltage model calculating unit 124 outputs the calculated gate bias voltage Vbg to the amplifier model unit 130, as a state variable of the microwave power amplifier.

The drain bias voltage model calculating unit 125 calculates the drain bias voltage Vbd of the microwave power amplifier, based on a drain current "idd" output from the amplifier model unit 130. The drain bias voltage model calculating unit 125 may also calculate the drain bias voltage Vbd of the microwave power amplifier, based on the envelope env output from the envelope signal generating unit 110. The drain bias voltage model calculating unit 125 outputs the calculated drain bias voltage Vbd to the amplifier model unit 130, as a state variable of the microwave power amplifier.

The amplifier model unit 130 obtains the state variables that are output from the estimated temperature calculating unit 121, the gate lag model calculating unit 122, the drain lag model calculating unit 123, the gate bias voltage model calculating unit 124, and the drain bias voltage model calculating unit 125. The amplifier model unit 130 is a amplifier model unit that calculates the distortion of a signal output from the microwave power amplifier, based on the obtained state variables. For example, the amplifier model unit 130 calculates a gain distortion characteristic, "gain", and a phase distortion characteristic, "phase", for the signal output from the microwave power amplifier. The amplifier model unit 130 is an output unit that outputs the gain distortion characteristic "gain" and the phase distortion characteristic "phase" downstream.

The amplifier model unit 130 also has a function as a second state variable calculating unit that calculates state variables that are the state variables of the microwave power amplifier and that have no memory effect. For example, the amplifier model unit 130 calculates the power consumption pdd of the microwave power amplifier and outputs the calculated power consumption pdd to the estimated temperature calculating unit 121. The amplifier model unit 130 also calculates the effective envelope eenv to be added to the gate of the transistor of the microwave amplifier and outputs the calculated effective envelope eenv to the gate lag model calculating unit 122.

The amplifier model unit 130 calculates the output envelope envout of the microwave power amplifier and outputs the calculated output envelope envout to the drain lag model calculating unit 123. The amplifier model unit 130 also calculates a drain current idd of the transistor of the microwave power amplifier and outputs the calculated drain current idd to the drain bias voltage model calculating unit 125.

As described, the calculating apparatus 101 calculates the state variables of the microwave power amplifier that has the memory effect, and further calculates the signal distortion caused by the microwave power amplifier, based on the calculated state variables. Thus, even if not all the combinations of the memory effects and the distortion characteristics are calculated, the distortion characteristic of the microwave power amplifier having memory effect can be obtained. Therefore, the amount of calculation time for obtaining the distortion characteristics of the microwave power amplifier including memory effect can be reduced, whereby reduced power consumption and expedited calculation of the distortion characteristics can be facilitated.

Because the amount of the calculation can be reduced, a distortion characteristic can be obtained on which many state variables each having a memory effect are reflected, and the distortion characteristic can be obtained on which memory effects that each have been imparted for a long time are reflected. Therefore, the distortion characteristics of the microwave power amplifier that has a memory effect can be calculated accurately by a simple circuit.

In this embodiment, at least one of the state variables having memory effect is calculated from transmitting quadrature signal (I, Q), whereby the state variable(s) having a memory effect can be calculated accurately. More specifically, the state variables are calculated based on the envelope env of the quadrature signal (I, Q) that is obtained by correcting the signals (I, Q) for distortion and subjecting the corrected signals to quadrature modulation for supply to the microwave power amplifier 240. Alternatively, the state variables may be calculated based on the amplitude of the quadrature signal (I, Q) input to the microwave power amplifier.

A first state variable included among the state variables having a memory effect is calculated based on a second state variable that is different from the first state variable of the state variables calculated and, thereby, the first state variable can be calculated accurately when the first state variable varies according to the second state variable. For example, the gate bias voltage Vbg (the first state variable) is calculated based on the calculated junction temperature tj (the second variable), whereby the gate bias voltage Vbg can be calculated accurately using a forward voltage of a diode that varies according to the junction temperature tj.

A state variable of the microwave power amplifier and having no memory effect is calculated, where at least any one of the state variables having a memory effect is calculated based on the state variable having no memory effect. Thus, the state variable having a memory effect can be calculated accurately when the state variable having the memory effect varies according to the state variable having no memory effect.

For example, the junction temperature tj is calculated based on the power consumption pdd, whereby the junction temperature tj that varies according to the history of the power consumption pdd can be calculated accurately. The gate lag signal ge is calculated based on the effective envelope eenv, whereby the gate lag ge that varies according to the effective envelope eenv can be calculated accurately. The drain lag signal de is calculated based on the output envelope envout, whereby the drain lag signal de that varies according to the output envelope envout can be calculated accurately. The gate bias voltage Vbg is calculated based on the drain current idd, whereby the gate bias voltage Vbg that varies according to the drain current idd can be calculated accurately.

The signal distortion caused by the microwave power amplifier is calculated based on the quadrature signal (I, Q) input into the microwave power amplifier and the state variables having a memory effect. In this manner, by taking into consideration the quadrature signal (I, Q) that is input into the microwave power amplifier, the signal distortion caused by the microwave power amplifier can be calculated more accurately.

A state variable of the microwave power amplifier and having no memory effect may be calculated, where the signal distortion caused by the microwave power amplifier can be calculated based on the state variables having a memory effect and the state variable having no memory effect. In this manner, by taking into consideration the state variables having no memory effect, the signal distortion caused by the microwave power amplifier can be calculated more accurately.

Figure 1B:
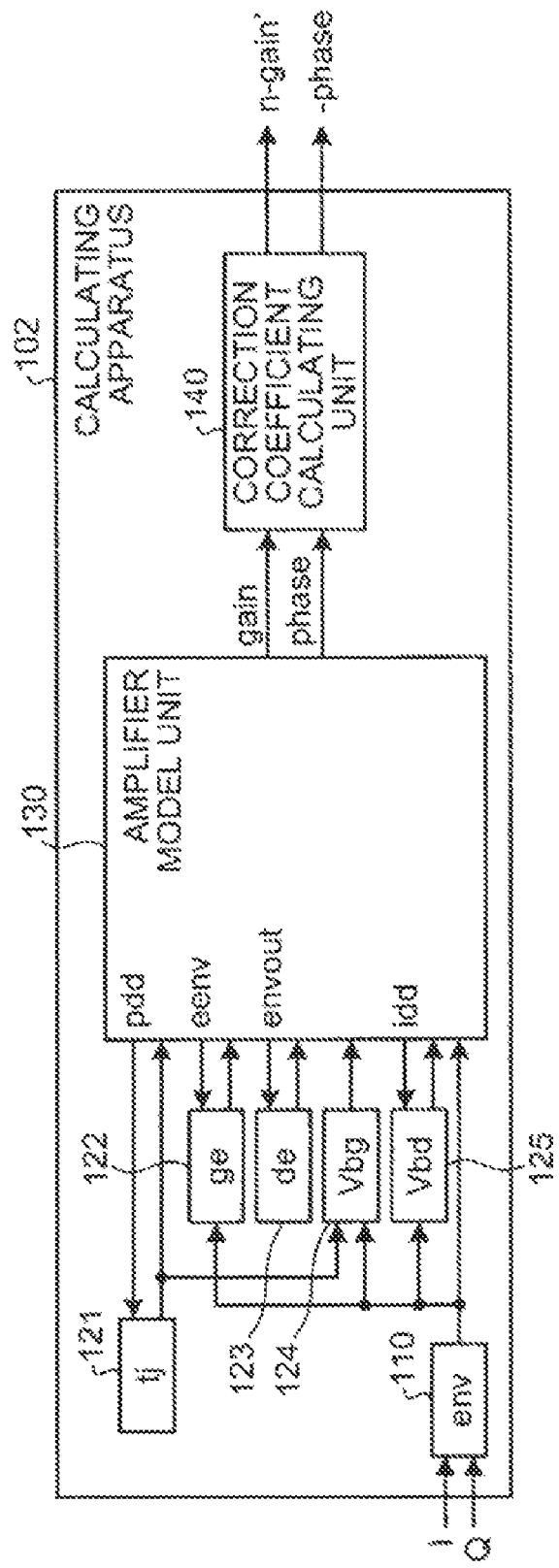
FIG. 1B is a block diagram of a second exemplary configuration of the calculating apparatus according to the embodiment.

FIG. 1B is a block diagram of a second exemplary configuration of the calculating apparatus according to the embodiment. In FIG. 1B, components identical to those depicted in FIG. 1A are given the same reference numerals used in FIG. 1A and will not again be described. A calculating apparatus 102 includes a correction coefficient calculating unit 140 in addition to the configuration of the calculating apparatus 101 depicted in FIG. 1A. The amplifier model unit 130 outputs the calculated gain distortion characteristic "gain" and the calculated phase distortion characteristic "phase" to the correction coefficient calculating unit 140.

The correction coefficient calculating unit 140 calculates an inverse property of the gain distortion characteristic "gain" and of the phase distortion characteristic "phase" output from the amplifier model unit 130 and thereby, calculates the correction coefficient of the signal to be amplified by the microwave power amplifier. More specifically, the correction coefficient calculating unit 140 calculates the inverse of the gain distortion characteristic "gain" and thereby, calculates a gain correction coefficient "n-gain'". The correction coefficient calculating unit 140 calculates a phase correction coefficient "-phase" that is obtained by inverting the phase of the phase distortion characteristic "phase". The correction coefficient calculating unit 140 outputs the calculated gain correction coefficient "n-gain" and the calculated phase correction coefficient "-phase".

In this manner, the calculating apparatus 102 calculates the correction coefficients based on the distortion characteristics calculated by the amplifier model unit 130 and thereby, can obtain the correction coefficients of a signal to be amplified by the microwave power amplifier without calculating the combinations of the memory effects and the distortion properties. Therefore, the amount of calculation can be reduced for calculating the correction coefficients of the signal to be amplified by the microwave power amplifier. Therefore, reduction of the power consumption and expediting of the calculation of the correction coefficients can be facilitated.

Because the amount of the calculation can be reduced, the correction coefficients can be obtained on which many state variables having a memory effect are reflected and the correction coefficients can be obtained on which memory effects that each has been imparted for a long time are reflected.

Therefore, correction coefficients can be calculated that accurately correct a signal amplified by a microwave power amplifier that has a memory effect.

The calculating apparatuses 101 and 102 respectively depicted in FIGS. 1A and 1B can each be implemented by a computing unit such as, for example, a field programmable gate array (FPGA).

FIG. 2 is a block diagram of an exemplary configuration of an amplifying apparatus and a distortion correcting apparatus according to the embodiment. With reference to FIG. 2, a configuration will be described that uses the calculating apparatus 102 depicted in FIG. 1B for distortion correction of a microwave power amplifier. As depicted in FIG. 2, an amplifying apparatus 200 according to the embodiment includes a distortion correcting apparatus 210, digital/analog converters (D/A converters) 221 and 222, an orthogonal modulating unit 230, a microwave power amplifier 240, a coupler 251, an attenuator 252, a frequency converting unit 253, an analog/digital converter (A/D converter) 254, an orthogonal demodulating unit 255, and a parameter updating unit 260.

In the embodiment, signals to be input into the amplifying apparatus 200 are orthogonal base band signals (I, Q) of "I-ch" and "Q-ch". Each signal input into the amplifying apparatus 200 is input into the distortion correcting apparatus 210 and the parameter updating unit 260. The distortion correcting apparatus 210 includes the calculating apparatus 102 (see FIG. 1B), a gain correcting unit 211, and a phase correcting unit 212.

The calculating apparatus 102 calculates the gain distortion characteristic "gain", the phase distortion characteristic "phase", the gain correction coefficient n-gain', and the phase correcting coefficient -phase, based on the signals input thereto. The calculating apparatus 102 outputs the calculated gain correction coefficient n-gain' to the gain correcting unit 211, outputs the calculated phase correction coefficient -phase to the phase correcting unit 212, and further outputs the calculated gain distortion characteristic "gain" and the calculated phase distortion characteristic "phase" to the parameter updating unit 260.

The gain correcting unit 211 (gain) executes pre-distortion on each signal input thereto, based on the gain correction coefficient n-gain' output from the calculating apparatus 102. More specifically, the gain correcting unit 211 multiplies each signal by the gain correction coefficient n-gain'. Thereby, the inverse of the gain distortion characteristic of the microwave power amplifier 240 is imparted to each signal, whereby the gain distortion of the signal output from the microwave power amplifier 240 can be corrected. The gain correcting unit 211 outputs to the phase correcting unit 212, each signal on which pre-distortion has been executed.

The phase correcting unit 212 (Rot) executes pre-distortion on each signal output from the gain correcting unit 211, based on the phase correction coefficient -phase output from the calculating apparatus 102. More specifically, the phase correcting unit 212 multiplies each signal by the phase correction coefficient -phase. Thereby, the inverse of the phase distortion characteristic of the microwave power amplifier 240 is imparted to each signal, whereby the phase distortion of the signal output from the microwave power amplifier 240 can be corrected. The phase correcting unit 212 outputs to the D/A converters 221 and 222, each signal on which pre-distortion has been executed.

The D/A converters 221 and 222 respectively convert each signal output from the distortion correcting apparatus 210, from a digital signal to an analog signal. The D/A converters 221 and 222 respectively output to the orthogonal modulating unit 230, the converted signals. The orthogonal modulating unit 230 (Q-MOD: quadrature modulator) orthogonally modulates each of the signals output from the D/A converters 221 and 222. The orthogonal modulating unit 230 outputs the modulated signal to the microwave power amplifier 240.

The microwave power amplifier 240 amplifies the signal output from the orthogonal modulating unit 230. The microwave power amplifier 240 is a power amplifier (PA) that uses transistors such as, for example, a field effect transistor (FET). The microwave power amplifier 240 outputs the amplified signal to the coupler 251.

The coupler 251, the attenuator 252, the frequency converting unit 253, the A/D converter 254, and the orthogonal demodulating unit 255 configure a feedback system that feeds back the signal amplified by the microwave power amplifier 240. More specifically, the coupler 251 branches the signal output from the microwave power amplifier 240 and outputs one branch downstream (PA out). The coupler 251 outputs the other branch to the attenuator 252.

The attenuator 252 (ATT) attenuates the signal output from the coupler 251, and outputs the attenuated signal to the frequency converting unit 253. The frequency converting unit 253 down-converts the signal that is output from the attenuator 252 into an orthogonal base band signal and outputs the down-converted signal to the A/D converter 254.

The A/D converter 254 converts the signal that is output from the frequency converting unit 253, from the analog signal to a digital signal, and outputs the converted signal to the orthogonal demodulating unit 255. The orthogonal demodulating unit 255 (Q-DEM: quadrature demodulator) orthogonally modulates the signal that is output from the A/D converter 254 and outputs to the parameter updating unit 260, signals (I', Q') of I-ch and Q-ch obtained by the quadrature modulation.

The parameter updating unit 260 compares the signals (I, Q) of the orthogonal base band signals input into the amplifying apparatus 200 and the signals (I', Q') output from the orthogonal demodulating unit 255, and updates the parameters of the calculating apparatus 102 such that the difference (error) obtained as the result of the comparison becomes small. The parameters of the calculating apparatus 102 are, for example, values of a lookup table (LUT) and coefficients of a computing unit to be used in the calculation of the state variables or the distortion properties by the calculating unit 102.

As described, the parameters used in the calculation of the state variables or the distortion properties are updated based on the signal obtained by feeding back the signal amplified by the microwave power amplifier 240 and thus, adaptive control can be executed for the calculation of the state variables or the distortion properties. Thereby, the parameters used in the calculation of the state variables or the distortion properties can be adaptively controlled according to the environmental changes and thus, the signal distortion caused by the microwave power amplifier 240 can be corrected more accurately.

Nonetheless, the amplifying apparatus 200 may be configured to omit the coupler 251, the attenuator 252, the frequency converting unit 253, the A/D converter 254, the orthogonal demodulating unit 255, and the parameter updating unit 260 and to execute no adaptive control of the calculation of the state variables or the distortion properties.

As described, according to the amplifying apparatus 200, the calculating apparatus 102 can calculate the correction coefficients at a high speed and therefore, convergence of the correction of the signal in the gain correcting unit 211 and the phase correcting unit 212 can be improved. Hence, the quality of the output signal of the microwave power amplifier 240 can be improved.

Figure 3:
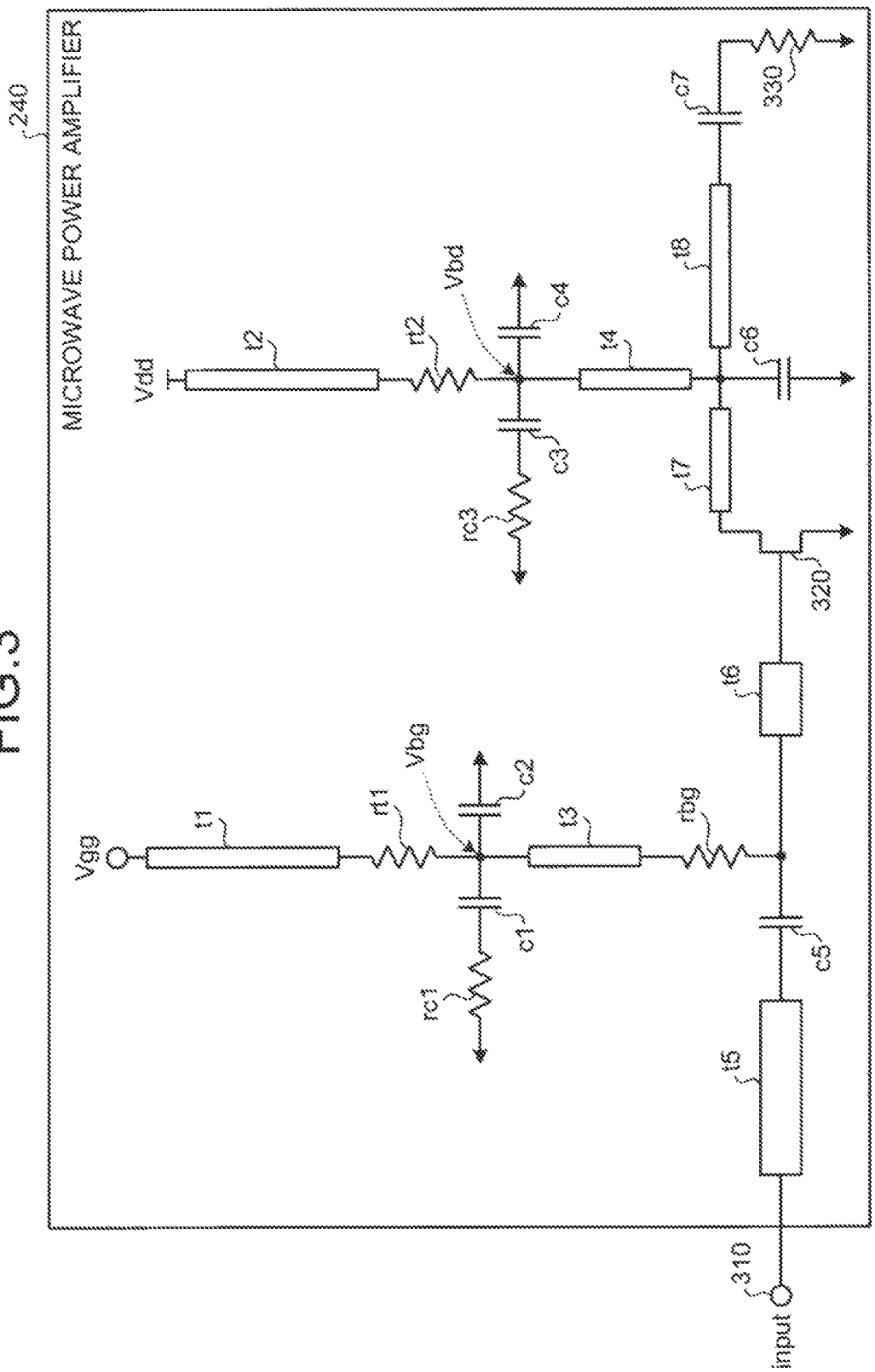
FIG. 3 is a circuit diagram of an example of a microwave power amplifier.

FIG. 3 is a circuit diagram of an example of the microwave power amplifier. An exemplary configuration of the microwave power amplifier 240 that uses a gallium nitride high electron mobility transistor (GaN HEMT) will be described with reference to FIG. 3. As depicted in FIG. 3, the microwave power amplifier 240 includes an input unit 310, supply lines t1 and t2, transmission lines t3 to t8, bypass capacitors c1 to c4, capacitors c5 to c7, a transistor 320, and a resistance 330.

A gate bias voltage source Vgg supplies a gate bias voltage Vbg. Resistance rt1 is (parasitic) resistance in the supply line t1. Resistance rc1, and the bypass capacitors c1 and c2 smooth the gate bias voltage Vbg. The λ/4 transmission line t3 supplies the gate bias voltage Vbg to a gate electrode of the transistor 320 through a stabilizing resistance rbg.

The resistance rt1, which is an internal resistance of the bypass capacitor c1, is 0.05 [Ω], for example. The resistance rc1 is, for example, 2 [Ω]. The capacitance of the bypass capacitor c1 is, for example, 1 [μF]. The capacitance of the bypass capacitor c2 is, for example, 3,000 [pF]. The resistance value of the stabilizing resistance rbg is, for example, 15 [Ω].

A power voltage supply source Vdd supplies a drain bias voltage Vbd through the supply line t2. Resistance rt2 is (parasitic) resistance of the supply line t2. The bypass capacitor c3 or c4 smoothes the drain bias voltage Vbd through an internal resistance rc3 of the bypass capacitor c3. The λ/4 transmission line t4 supplies the drain bias voltage Vbd to a drain electrode of the transistor 320 through the transmission line t7.

The resistance rt2 is 0.05 [Ω], for example. The resistance rc3 which is the internal resistance of the bypass capacitor c3 is, for example, 2 [Ω]. The capacitance of the bypass capacitor c3 is, for example, 2.2 [μF]. The capacitance of the bypass capacitor c4 is, for example, 20,000 [pF]. The length of the transmission line t7 is, for example, 1.9 [cm]. The characteristic impedance of the transmission line t7 is, for example, 50 [Ω].

The input unit 310 (input) receives the signal output from the orthogonal modulating unit 230. The transmission lines t5 and t6 and the capacitor c5 configure a matching circuit. The signal that is input into the input unit 310 is supplied to the gate electrode of the transistor 320 through the transmission lines t5 and t6 and the capacitor c5.

The length of the transmission line t5 is 1.8 [cm], for example. The characteristic impedance of the transmission line t5 is, for example, 16 [Ω]. The capacitance of the capacitor c5 is, for example, 7 [pF]. The length of the transmission line t6 is, for example, 9 [mm]. The resistance value of the transmission line t6 is, for example, 16 [Ω].

The drain electrode of the transistor 320 is connected to the transmission lines t7 and t8, the capacitors c6 and c7, and the resistance 330. The transmission lines t7 and t8, and the capacitors c6 and c7 configure an output matching circuit.

The capacitance of the capacitor c6 is 0.5 [pF], for example. The length of the transmission line t8 is, for example, 3.4 [cm]. The characteristic impedance of the transmission line t8 is, for example, 50 [Ω]. The capacitance of the capacitor c7 is, for example, 5.7 [pF]. The resistance value of the resistance 330 is, for example, 50 [Ω].

For the microwave power amplifier 240 that is a power amplifier for medium to high power, a bias class of the class AB or higher is used to obtain the power efficiency. Therefore, when the input signal is amplitude-modulated, the source current is significantly varied by the signal envelope, whereby the drain bias voltage Vbd on the substrate also varies and therefore, the drain bias voltage Vbd can not be completely removed even by the bypass capacitors c3 and c4.

It is known that the gate bias voltage Vbg on the substrate also varies due to the relation of the signal envelope and the device properties.

Due to the variation of the drain bias voltage Vbd or the gate bias voltage Vbg, a property of the semiconductor device, which is a non-linear device, varies and thus, the signal distortion caused by the microwave power amplifier 240 varies. The variation of the drain bias voltage Vbd or the gate bias voltage Vbg that occurs corresponding to the signal envelope exhibits temporal mitigation or oscillating mitigation due to the supply lines t1 and t2, the resistances rt1, rt2, rc1, and rc3, and the bypass capacitors c1 to c4.

Therefore, the distortion characteristics of the microwave power amplifier 240 have memory effect. The memory effects of the state variables of the microwave power amplifier 240 include the thermal memory effect and a memory effect caused by the trap level of the semiconductor device.

Figure 4:
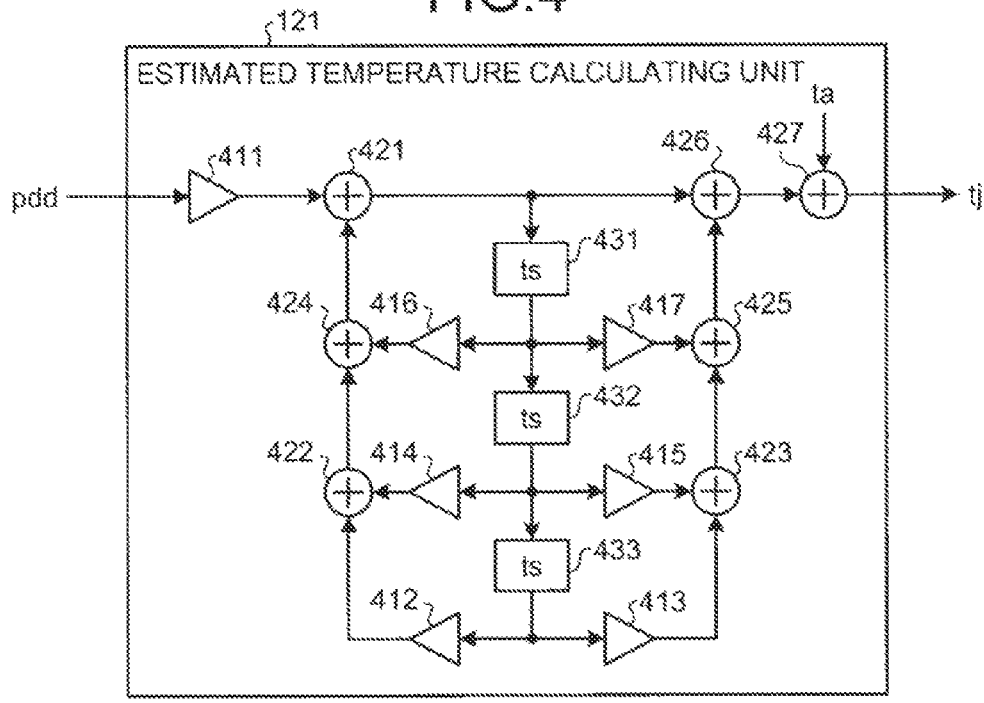
FIG. 4 is a block diagram of an example of an estimated temperature calculating unit.

FIG. 4 is a block diagram of an example of the estimated temperature calculating unit. The estimated temperature calculating unit 121 depicted in FIG. 4 calculates the memory effect using a third-order linear infinite impulse response (IIR) filter. The estimated temperature calculating unit 121 includes multiplying units 411 to 417, adding units 421 to 427, and delay units 431 to 433 (ts).

The power consumption pdd that is input into the estimated temperature calculating unit 121 is input into the multiplying unit 411. The multiplying unit 411 multiplies the signal input thereto (in this case, the power consumption pdd) by a filter coefficient and outputs the resulting signal to the adding unit 421. The adding unit 421 adds the signal output from the multiplying unit 411 and a signal output from the adding unit 424 and outputs the resulting signal to the delay unit 431 and the adding unit 426.

The delay unit 431 delays, by one clock, the signal that is output from the adding unit 421 and outputs the delayed signal to the delay unit 432 and the multiplying units 416 and 417. The delay unit 432 delays, by one clock, the signal that is output from the delay unit 431 and outputs the delayed signal to the delay unit 433 and the multiplying units 414 and 415. The delay unit 433 delays, by one clock, the signal that is output from the delay unit 432 and outputs the delayed signal to the multiplying units 412 and 413.

The multiplying unit 412 multiplies the signal that is output from the delay unit 433 by the filter coefficient and outputs the resulting signal to the adding unit 422. The multiplying unit 413 multiplies the signal that is output from the delay unit 433 by the filter coefficient and outputs the resulting signal to the adding unit 423. The multiplying unit 414 multiplies the signal that is output from the delay unit 432 by the filter coefficient and outputs the resulting signal to the adding unit 422. The multiplying unit 415 multiplies the signal that is output from the delay unit 432 by the filter coefficient and outputs the resulting signal to the adding unit 423. The multiplying unit 416 multiplies the signal that is output from the delay unit 431 by the filter coefficient and outputs the resulting signal to the adding unit 424. The multiplying unit 417 multiplies the signal that is output from the delay unit 431 by the filter coefficient and outputs the resulting signal to the adding unit 425.

The adding unit 422 adds the signal that is output from the multiplying unit 412 and the signal that is output from the multiplying unit 414, and outputs the resulting signal to the adding unit 424. The adding unit 423 adds the signal that is output from the multiplying unit 413 and the signal that is output from the multiplying unit 415, and outputs the resulting signal to the adding unit 425. The adding unit 424 adds the signal that is output from the adding unit 422 and the signal that is output from the multiplying unit 416, and outputs the resulting signal to the adding unit 421. The adding unit 425 adds the signal that is output from the adding unit 423 and the signal that is output from the multiplying unit 417, and outputs the resulting signal to the adding unit 426. The adding unit 426 adds the signal that is output from the adding unit 421 and the signal that is output from the adding unit 425, and outputs the resulting signal to the adding unit 427.

The adding unit 427 adds the signal that is output from the adding unit 426 and an ambient temperature ta. The ambient temperature ta is, for example, an external temperature or a temperature measured by a temperature monitor externally equipped on the amplifying apparatus 200. Alternatively, the normal temperature as the ambient temperature ta may be stored in a memory of the distortion correcting apparatus 210, as a constant. The adding unit 427 outputs the result of the addition as the junction temperature tj of the microwave power amplifier 240.

Figure 5:
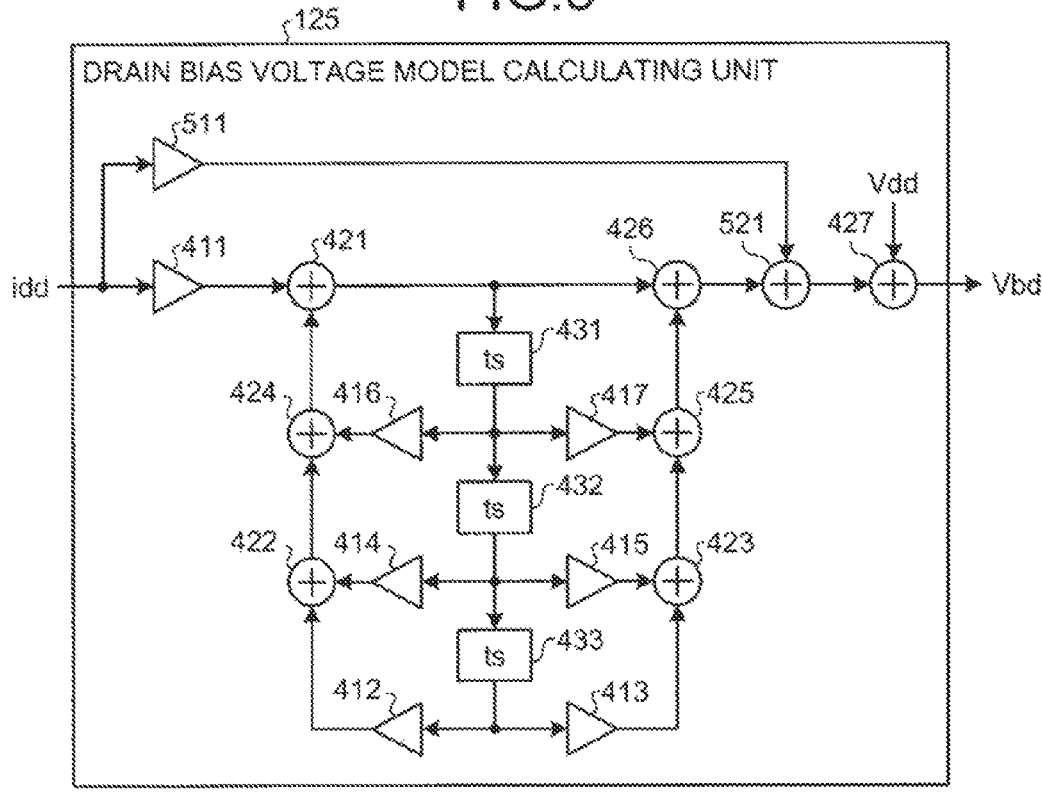
FIG. 5 is a block diagram of an example of a drain bias voltage model calculating unit.

FIG. 5 is a block diagram of an example of the drain bias voltage model calculating unit. In FIG. 5, components identical to those depicted in FIG. 4 are given the same reference numerals used in FIG. 4 and will not again be described. The drain bias voltage model calculating unit 125 depicted in FIG. 5 calculates the memory effect using the third-order IIR filter. The drain bias voltage model calculating unit 125 includes a multiplying unit 511 and an adding unit 521 in addition to the configuration of the estimated temperature calculating unit 121 depicted in FIG. 4.

The drain current idd input into the drain bias voltage model calculating unit 125 is input into the multiplying unit 511 and the multiplying unit 411. The multiplying unit 511 multiplies a signal input thereto (in this case, the drain current idd) by the filter coefficient and outputs the resulting signal to the adding unit 521. The multiplying unit 411 multiplies the signal input thereto (in this case, the drain current idd) by the filter coefficient and outputs the resulting signal to the adding unit 421. The adding unit 426 outputs to the adding unit 521, a signal obtained by addition.

The adding unit 521 adds the signal that is output from the adding unit 426 and the signal that is output from the multiplying unit 511, and outputs the resulting signal to the adding unit 427. The adding unit 427 adds the signal that is output from the adding unit 521 and the power source voltage Vdd. The power source voltage Vdd is stored in, for example, the memory of the distortion correcting apparatus 210, as a constant. The adding unit 427 outputs the result of the addition as the drain bias voltage Vbd of the microwave power amplifier 240.

Figure 6:
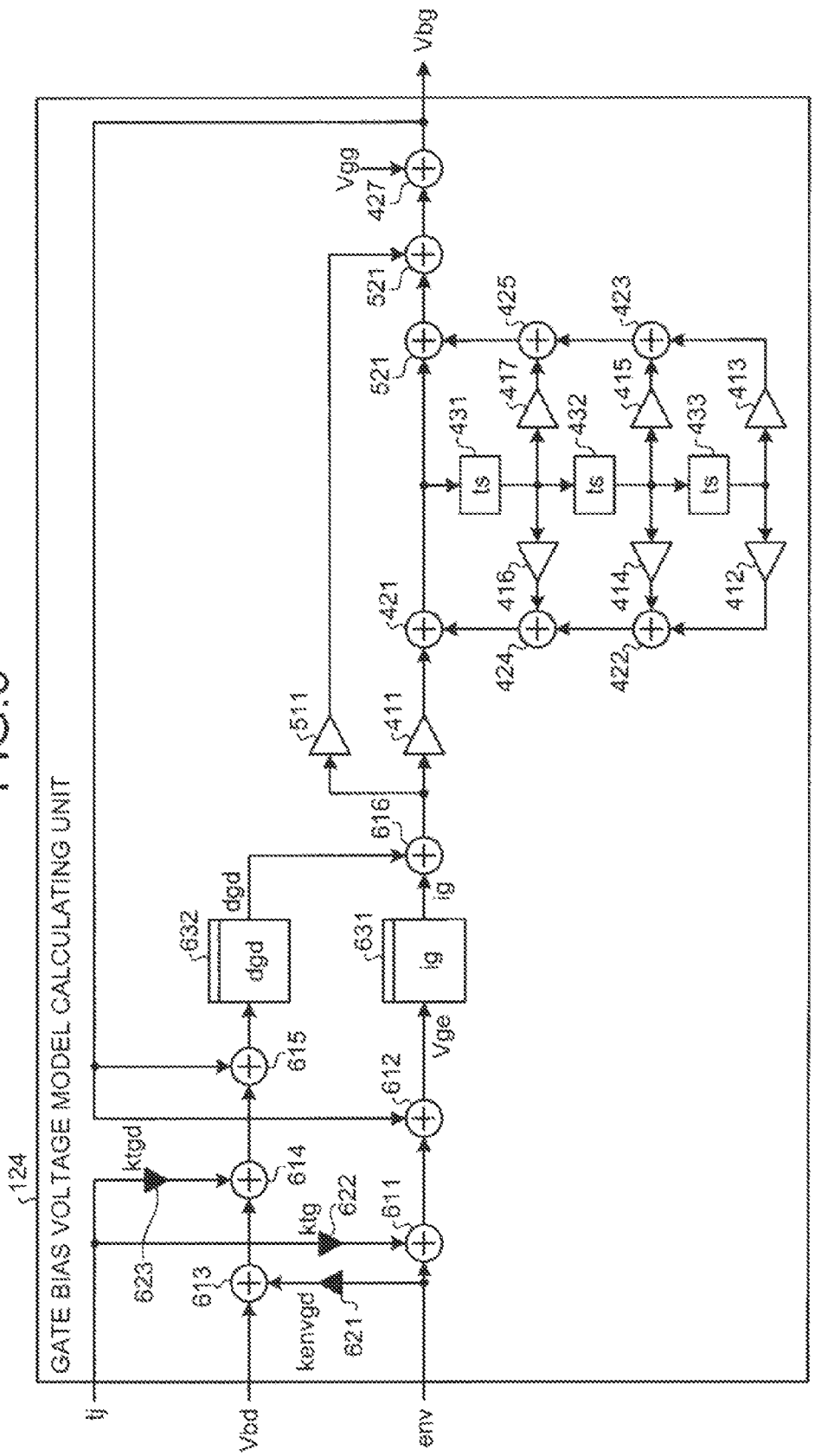
FIG. 6 is a block diagram of an example of a gate bias voltage model calculating unit.

FIG. 6 is a block diagram of an example of the gate bias voltage model calculating unit. In FIG. 6, components identical to those depicted in FIG. 5 are given the same reference numerals used in FIG. 5 and will not again be described. The gate bias voltage model calculating unit 124 depicted in FIG. 6 calculates the memory effect using the third-order IIR filter. The gate bias voltage model calculating unit 124 includes adding units 611 to 616, multiplying units 621 to 623, and LUTs 631 and 632 in addition to the configuration of the drain bias voltage model calculating unit 125 depicted in FIG. 5.

The envelope env input into the gate bias voltage model calculating unit 124 is input into the adding unit 611 and the multiplying unit 621. The junction temperature tj that is input into the gate bias voltage model calculating unit 124 is input into the multiplying units 622 and 623. The drain bias voltage Vbd that is input into the gate bias voltage model calculating unit 124 is input into the adding unit 613.

The multiplying unit 621 multiplies the envelope env input thereto by a coefficient "kenvgd", and outputs the resulting signal to the adding unit 613. The multiplying unit 622 multiplies the junction temperature tj input thereto, by a coefficient "ktg", and outputs the resulting signal to the adding unit 611. The multiplying unit 623 multiplies the junction temperature tj input thereto, by a coefficient "ktgd", and outputs the resulting signal to the adding unit 614.

The adding unit 611 adds the envelope env input thereto and the signal that is output from the multiplying unit 622, and outputs the resulting signal to the adding unit 612. The adding unit 612 adds the signal that is output from the adding unit 611 and the gate bias voltage Vbg output from the adding unit 427, and outputs the resulting signal to the LUT 631, as a voltage Vge that is an effective voltage between the gate and the source of the transistor 320.

The adding unit 613 adds the signal that is output from the multiplying unit 621 and the drain bias voltage Vbd input thereto, and outputs the resulting signal to the adding unit 614. The adding unit 614 adds the signal that is output from the adding unit 613 and the signal that is output from the multiplying unit 623, and outputs the resulting signal to the adding unit 615. The adding unit 615 adds the signal that is output from the adding unit 614 and the gate bias voltage Vbg output from the adding unit 427, and outputs the resulting signal to the LUT 632, as the effective voltage between the gate and the drain of the transistor 320.

The LUT 631 correlates the voltage Vge between the gate and the source of the transistor 320 with a current ig between the gate and the source of the transistor 320 (a non-linear model). The LUT 631 outputs to the adding unit 616, the current ig between the gate and the source corresponding to the voltage Vge output from the adding unit 612.

The LUT 632 correlates the voltage between the gate and the drain of the transistor 320 with "dgd" between the gate and the drain of the transistor 320 (a non-linear model). The LUT 632 outputs to the adding unit 616, the "dgd" between the gate and the drain corresponding to the voltage output from the adding unit 615.

The adding unit 616 adds the current ig between the gate and the source output from the LUT 631 and "dgd" between the gate and the drain output from the LUT 632, and outputs the resulting signal to the multiplying units 411 and 511. The multiplying units 411 and 511 respectively multiply the signal that is output from the adding unit 616, by the filter coefficient.

The adding unit 427 adds the signal that is output from the adding unit 521 and the gate bias voltage source Vgg. The gate bias voltage source Vgg is stored in a memory of the distortion correcting apparatus 210 as, for example, a constant. The adding unit 427 outputs the result of the addition to the adding units 612 and 615, as the gate bias voltage Vbg of the microwave power amplifier 240, and outputs the gate bias voltage Vbg downstream.

In this manner, the gate bias voltage model calculating unit 124 outputs the gate bias voltage Vbg that is obtained by varying the gate bias voltage source Vgg using the output signal of the adding unit 616. Although a configuration has been described that is adapted to obtain the non-linear current ig between the gate and the source using the LUT 631, the current ig between the gate and the source may also be obtained by computing equation (2) below. In equation (2), "Is" represents a saturation current. "Vf" represents a forward voltage. Further, although a configuration has been described that is adapted to obtain non-linear dgd between the gate and the drain using the LUT 632, the dgd between the gate and the drain may also be obtained by predetermined computing similarly to the current ig between the gate and the source.

$$ig = Is(e^{Vge/Vj} - 1) \tag{2}$$

The configuration of the gate bias voltage model calculating unit 124 is not limited to the configuration depicted in FIG. 6. For example, when a GaN HEMT that is a wideband gap semiconductor is applied to the microwave power amplifier 240, substantially no forward conduction between the gate and the drain occurs during the operation. Therefore, the gate bias voltage model calculating unit 124 depicted in FIG. 6 may be configured to omit the adding units 613 to 615, the multiplying units 621 and 623, and the LUT 632.

Figure 7:
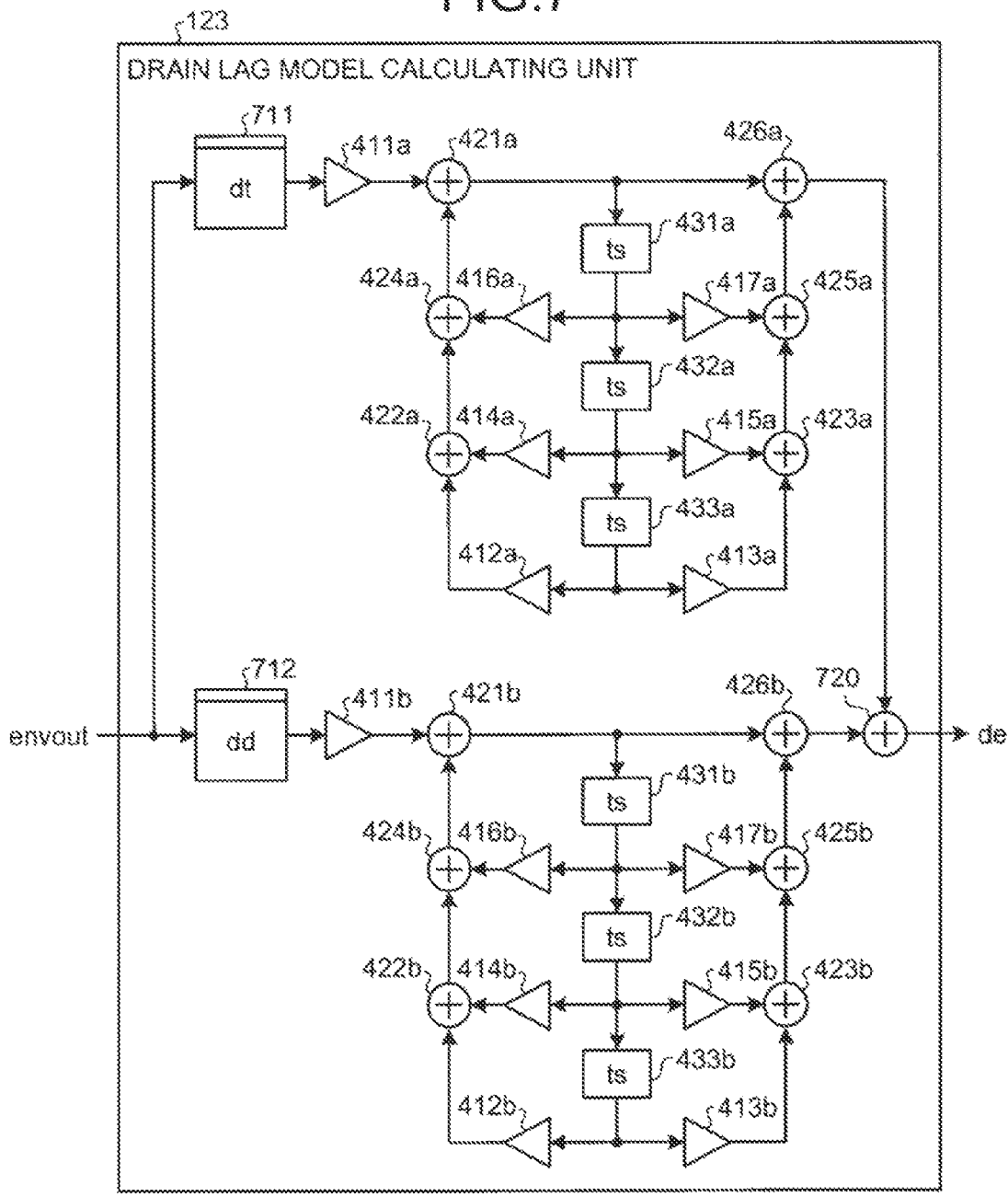
FIG. 7 is a block diagram of an example of a drain lag model calculating unit.

FIG. 7 is a block diagram of an example of the drain lag model calculating unit. As depicted in FIG. 7, the drain lag model calculating unit 123 includes LUTs 711 and 712, multiplying units 411a to 417a and 411b to 417b, adding units 421a to 426a and 421b 426b, delay units 431a to 433a and 431b to 433b, and an adder 720. The output envelope envout input into the drain lag model calculating unit 123 is input into the LUTs 711 and 712.

The LUT 711 correlates the output envelope envout with a trap rate dt, and outputs to the multiplying unit 411a, the trap rate dt that corresponds to the output envelope envout input thereto. The LUT 712 correlates the output envelope envout with a de-trap rate dd, and outputs to the multiplying unit 411b, the de-trap rate dd that corresponds to the output envelope envout input thereto.

The multiplying units 411a to 417a, the adding units 421a to 426a, and the delay units 431a to 433a respectively have identical configurations to those of the multiplying units 411 to 417, the adding units 421 to 426, and the delay units 431 to 433 depicted in FIG. 4. The multiplying unit 411a multiplies the signal that is output from the LUT 711 (in this case, the trap rate dt), by the filter coefficient, and outputs the resulting signal to the adding unit 421a. The adding unit 426a outputs to the adder 720, a signal obtained by addition.

The multiplying units 411b to 417b, the adding units 421b to 426b, and the delay units 431b to 433b respectively have identical configurations to those of the multiplying units 411 to 417, the adding units 421 to 426, and the delay units 431 to 433 depicted in FIG. 4. The multiplying unit 411b multiplies the signal that is output from the LUT 712 (in this case, the de-trap rate dd), by the filter coefficient, and outputs the resulting signal to the adding unit 421b. The adding unit 426b outputs to the adder 720, a signal obtained by addition.

The adder 720 adds the signal that is output from the adding unit 426a and the signal that is output from the adding unit 426b, and outputs the resulting signal downstream, as the drain lag signal de. In this manner, the trap rate dt and the de-trap rate dd that correspond to a drain voltage waveform (the output envelope envout) are calculated and are added to each other. Thereby, the drain lag signal de is obtained.

It is known that the de-trap rate dd of the transistor 320 that is related to the drain lag signal de that varies according to the drain voltage of the transistor 320. The trapping and releasing of charge each follow a different time constant and therefore, variation of the property of the transistor 320 associated with the drain lag signal de can be calculated accurately by using different time constants as in the configuration depicted in FIG. 6. However, a simpler configuration than the above may be used by using one time constant. Here, a phenomenon called low frequency dispersion is also included in the drain lag signal de.

Figure 8:
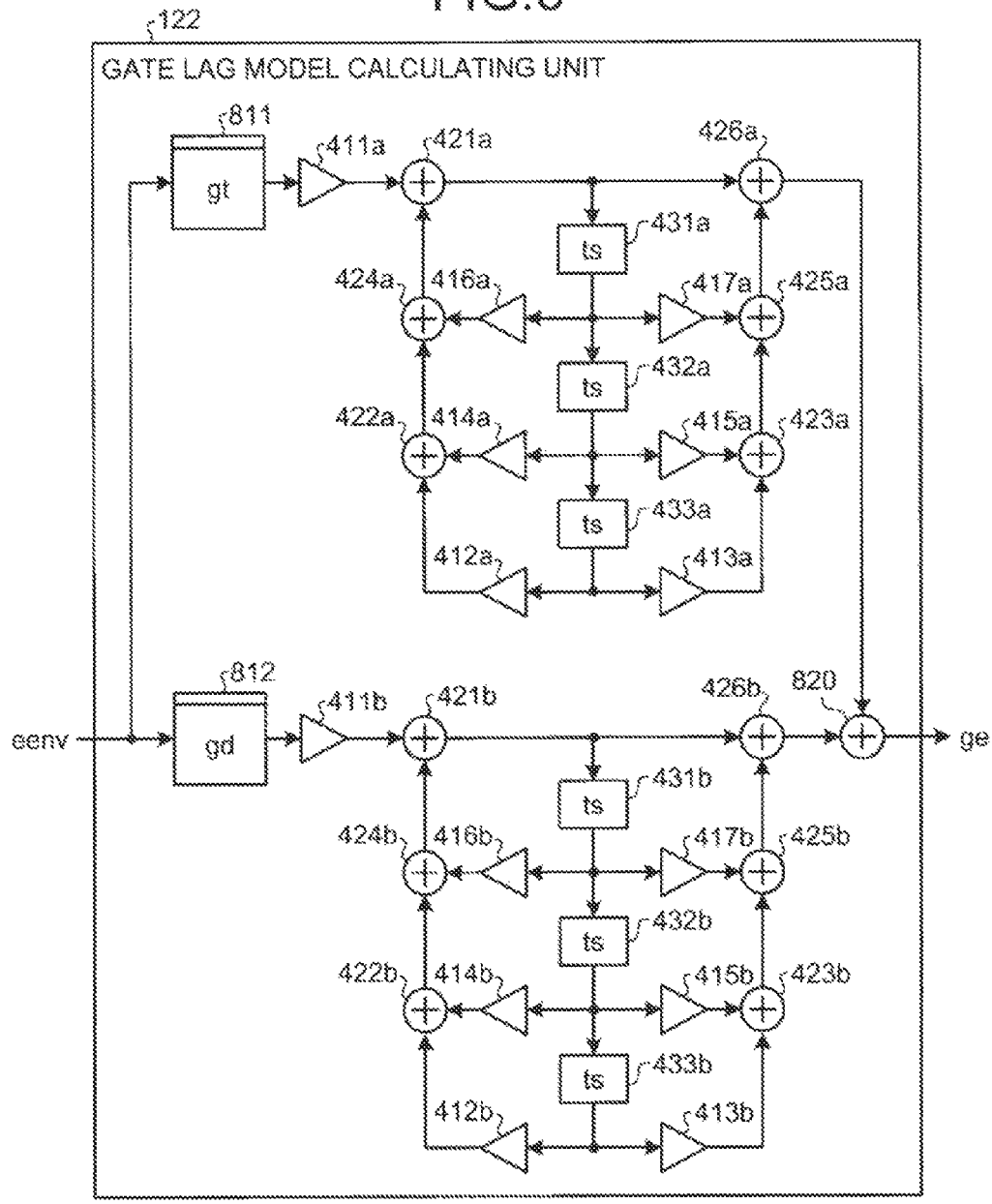
FIG. 8 is a block diagram of an example of a gate lag model calculating unit.

FIG. 8 is a block diagram of an example of the gate lag model calculating unit. In FIG. 8, components identical to those depicted in FIG. 7 are given the same reference numerals used in FIG. 7 and will not again be described. As depicted in FIG. 8, the gate lag model calculating unit 122 includes LUTs 811 and 812, the multiplying units 411a to 417a and 411b to 417b, the adding units 421a to 426a and 421b to 426b, the delay units 431a to 433a and 431b to 433b, and an adder 820. The effective envelope eenv that is input into the gate lag model calculating unit 122 is input into the LUTs 811 and 812.

The LUT 811 correlates the effective envelope eenv with a trap rate gt, and outputs to the multiplying unit 411a, the trap rate gt that corresponds to the effective envelope eenv input thereto. The LUT 812 correlates the effective envelope eenv with a de-trap rate gd, and outputs to the multiplying unit 411b, the de-trap rate gd that corresponds to the effective envelope eenv input thereto.

The multiplying unit 411a multiplies the signal that is output from the LUT 811 (in this case, the trap rate gt), by the filter coefficient, and outputs the resulting signal to the adding unit 421a. The adding unit 426a outputs to the adder 820, a signal obtained by addition. The multiplying unit 411b multiplies the signal that is output from the LUT 812 (in this case, the de-trap rate gd), by a filter coefficient and outputs the resulting signal to the adding unit 421b. The adding unit 426b outputs to the adder 820, a signal obtained by addition.

The adder 820 adds the signal that is output from the adding unit 426a and the signal that is output from the adding unit 426b, and outputs the resulting signal, as the gate lag signal ge. In this manner, the trap rate gt and the de-trap rate gd that correspond to a gate voltage waveform (the effective envelope eenv) are calculated and are added to each other. Thereby, the gate lag signal ge is obtained.

It is known that the trap rate gt of the transistor 320 that is related to the gate lag signal ge is related to hole generation, the trapping cross-sectional area of each trap, and the density of traps, respectively varying according to the gate voltage of the transistor 320. It is also known that the de-trap rate gd of the transistor 320 that is related to the gate lag signal ge that varies according to the gate voltage of the transistor 320. The trapping and releasing of charge each follow a different time constant and therefore, variation of the property of the transistor 320 associated with the gate lag signal ge can be calculated accurately by using different time constants as in the configuration depicted in FIG. 7. However, a simpler configuration may consist of only one time constant.

Figure 9:
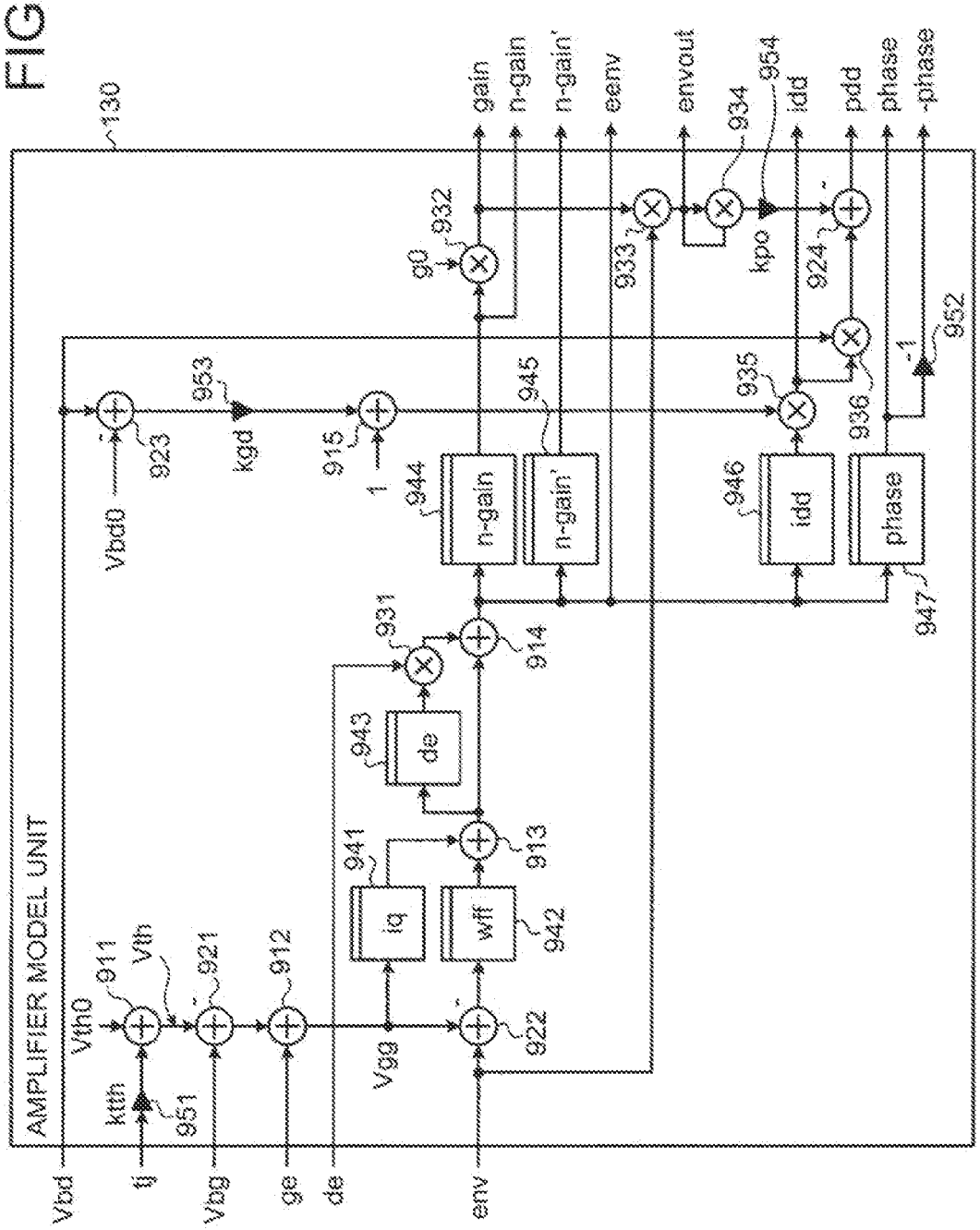
FIG. 9 is a block diagram of an example of an amplifier model unit.

FIG. 9 is a block diagram of an example of the amplifier model unit. The amplifier model unit 130 depicted in FIG. 9 reconstructs, based on the envelope env, a memory distortion characteristic of the microwave power amplifier 240 using the non-linear LUT. As depicted in FIG. 9, the amplifier model unit 130 includes adding units 911 to 915, subtracting units 921 to 924, multiplying units 931 to 936, LUTs 941 to 947, and multiplying units 951 to 954.

The drain bias voltage Vbd input into the amplifier model unit 130 is input into the subtracting unit 923 and the multiplying unit 936. The junction temperature tj input into the amplifier model unit 130 is input into the multiplying unit 951. The gate bias voltage Vbg input into the amplifier model unit 130 is input into the subtracting unit 921. The gate lag signal ge input into the amplifier model unit 130 is input into the adding unit 912. The drain lag signal de input into the amplifier model unit 130 is input into the multiplying unit 931. The envelope env input into the amplifier model unit 130 is input into the subtracting unit 922 and the multiplying unit 933.

The multiplying unit 951 multiplies the junction temperature tj input therein, by a proportion coefficient "ktth". Within the operating temperature range, temperature variation is substantially in proportion to the temperature variation from the base temperature, and the proportion coefficient ktth is a proportion coefficient of the temperature variation. The multiplying unit 951 outputs to the adding unit 911, the signal resulting from the multiplication. The adding unit 911 adds the signal that is output from the multiplying unit 951 and a base temperature Vth0, and outputs to the subtracting unit 921, the signal Vth obtained by the addition, as the temperature variation from the base temperature Vth0.

The subtracting unit 921 subtracts the signal Vth output from the adding unit 911 from the gate bias voltage Vbg input thereto, and outputs the resulting signal to the adding unit 912, as the effective gate bias voltage. The adding unit 912 adds the effective gate bias voltage output from the subtracting unit 921 and the gate lag signal ge, and outputs the resulting signal to the LUT 941 and the subtracting unit 922, as the gate bias voltage source Vgg.

The LUT 941 correlates the gate bias voltage source Vgg with a bias current iq, and outputs to the adding unit 913, the bias current iq that corresponds to the gate bias voltage source Vgg output from the adding unit 912.

The subtracting unit 922 subtracts the gate bias voltage source Vgg output from the adding unit 912, from the envelope env input thereto, and outputs the resulting signal to the LUT 942. The LUT 942 (wff: wave form factor) correlates the envelope env from which the gate bias voltage source Vgg has been subtracted and the effective amplitude of the signal. The effective amplitude of the signal included in the LUT 942 is, for example, the effective amplitude of a signal according to the operation class of the microwave power amplifier 240. The LUT 942 outputs to the adding unit 913, the distortion characteristic that corresponds to the signal output from the subtracting unit 922.

The adding unit 913 adds the bias current iq output from the LUT 941 and the distortion characteristic output from the LUT 942, and outputs the resulting signal to the LUT 943 and the adding unit 914.

The LUT 943 correlates the output of the adding unit 913 with effects of the drain lag signal de, and outputs to the adding unit 914, the drain lag signal de that corresponds to the signal output from the adding unit 913. The multiplying unit 931 multiplies the signal that is output from the LUT 943, by the drain lag signal de input thereto, and outputs the resulting signal to the adding unit 914, as the variation magnitude of the effective envelope at a noted time.

The adding unit 914 adds the output of the adding unit 913 and the amount to change the effective envelope output from the multiplying unit 931, and outputs the resulting signal to the LUTs 944 to 947 and downstream, as the effective envelope eenv.

The LUT 944 correlates the effective envelope eenv with a non-memory, non-linear amplitude distortion n-gain of the gain of the microwave power amplifier 240, normalized with the gain of a small signal, i.e., a normalized gain g0. The LUT 944 outputs to the multiplying unit 932 and downstream, the non-memory non-linear amplitude distortion n-gain that corresponds to the effective envelope eenv output from the adding unit 914.

The LUT 945 correlates the effective envelope eenv with the corrective value n-gain' of the gain distortion, and outputs downstream, the corrective value n-gain' that corresponds to the effective envelope eenv output from the adding unit 914.

The LUT 946 correlates the effective envelope eenv with the drain current idd, and outputs to the multiplying unit 935, the drain current idd that corresponds to the effective envelope eenv output from the adding unit 914.

The LUT 947 correlates the effective envelope eenv with the phase distortion characteristic "phase", and outputs the phase distortion characteristic "phase" that corresponds to the effective envelope eenv output from the adding unit 914 together with the phase correction coefficient -phase that is obtained by the inversion by the multiplying unit 952. The multiplying unit 952 inverts the sign of the phase distortion characteristic "phase" output from the LUT 947, and outputs the inverted property as the phase correction coefficient -phase.

The multiplying unit 932 multiplies the non-memory non-linear amplitude distortion n-gain output from the LUT 944 by the normalized gain g0, and outputs the resulting signal to the multiplying unit 933 and downstream, as the gain distortion characteristic "gain". The gain distortion characteristic "gain" output downstream by the multiplying unit 932 may, for example, be input into the parameter updating unit 260 and may be used in the adaptive control of the parameters by the parameter updating unit 260.

The multiplying unit 933 multiplies the envelope env input thereto, by the gain distortion characteristic "gain" output from the multiplying unit 932, and outputs the resulting signal downstream, as the output envelope envout, and further outputs the output envelope envout to the multiplying unit 934.

The multiplying unit 934 squares the output envelope envout output from the multiplying unit 933, and outputs the squared signal to the multiplying unit 954, as an output power index. The multiplying unit 954 multiplies the output power index output from the multiplying unit 934, by a coefficient kpo, and outputs to the subtracting unit 924, the output power obtained by the multiplication.

The subtracting unit 923 subtracts a base drain bias voltage Vbd0 from the drain bias voltage Vbd input thereto, and outputs the resulting signal to the multiplying unit 953, as a variation of the drain bias voltage Vbd. The multiplying unit 953 multiplies the variation of the drain bias voltage Vbd output from the subtracting unit 923, by a proportion coefficient kgd, and outputs the resulting signal to the adding unit 915, as a signal that represents the dependence of the drain current idd on the drain bias voltage Vbd.

Instead of the multiplying unit 953, an LUT may be provided that correlates the variation of the drain bias voltage Vbd with the dependence of the drain current idd on the drain bias voltage Vbd. Similarly, the dependence of the drain current idd on the effective envelope may be added. Instead of the multiplying unit 953, a calculating unit may be provided that calculates the dependence of the drain current idd on the drain bias voltage Vbd, from the variation of the drain bias voltage Vbd and using a non-linear function such as a polynomial. The adding unit 915 adds one to the signal that is output from the multiplying unit 953, and outputs the resulting signal to the multiplying unit 935.

The multiplying unit 935 multiplies the drain current idd output from the LUT 946, by the signal that is output from the adding unit 915, and outputs the resulting signal to the multiplying unit 936 and downstream, as the drain current idd. The multiplying unit 936 multiplies the drain current idd output from the multiplying unit 935, by the drain bias voltage Vbd input thereto.

The multiplying unit 936 outputs the resulting signal to the subtracting unit 924 as a power consumption idd*Vbd. The subtracting unit 924 subtracts the output power output from the multiplying unit 954, from the power consumption idd*Vbd output from the multiplying unit 936, and outputs the resulting signal downstream, as the power consumption pdd.

Although a configuration has been described that uses the third-order IIR filter to calculate the memory effects, the order of the filter is not limited to a third order. The configuration of the amplifier model unit 130 depicted in FIG. 9 is merely an example, and changes, addition, or omission may be made to each model depicted in FIG. 9. For example, distortions due to the drain lag signal de and the gate lag signal ge occur when a GaN HEMT is applied to the microwave power amplifier 240, and these distortions may be ignored when a gallium arsenide metal-semiconductor FET (GaAs MESFET) or a hetero-junction bipolar transistor (HBT) is applied to the microwave power amplifier 240. In this case, the configuration may be adapted to omit units that concern the drain lag signal de and the gate lag signal ge, such as the adding unit 912 and the multiplying unit 931.

The coefficients, the filter coefficients, the LUTs, etc., depicted in FIGS. 4 to 9 are parameters that are used in the calculation of the state variables or the distortion properties by the calculating apparatus 102. To calculate these parameters, a natural grade method, etc., can be used by executing actual measurement of or circuit simulation of the power amplifier that is applied to the microwave power amplifier 240. To calculate the parameters using the natural grade method, a method can be used such as that is disclosed in, for example, Japanese Laid-Open Patent Publication No. 2004-186258 or 2006-227847.

With respect to some or all of the parameters, adaptive control may be executed to update such parameters, based on a signal obtained by feeding back the signal amplified by the microwave power amplifier 240 as depicted in FIG. 2. In this case, for example, the parameters are updated by the adaptive control using, as the initial values of the parameters, the representative values determined by the semiconductor device and the power amplifier used.

FIG. 10 is a figure depicting distortion correction of a signal by the distortion correcting apparatus. In FIG. 10, the axis of abscissa represents the relative frequency [MHz] and the axis of ordinate represents the normalized response [dB] (taking 0 [dB] at the center). A spectrum 1001 represents a signal input into the amplifying apparatus 200.

A spectrum 1002 represents the signal output from the microwave power amplifier 240 and obtained when it is assumed that no correction by the distortion correcting apparatus 210 is executed. A spectrum 1003 represents the signal output from the microwave power amplifier 240 and obtained when it is assumed that correction by the conventional distortion correcting apparatus is executed. A spectrum 1004 represents the signal output from the microwave power amplifier 240 and obtained when it is assumed that correction by the distortion correcting apparatus 210 is executed. As depicted by the spectrum 1004, the distortion correcting apparatus 210 enables the distortion of the signal output from the microwave power amplifier 240 to be corrected accurately.

As described, according to the disclosure herein, highly accurate correction can be executed without increasing the amount of calculation for distortion correction by an amplifier. The calculating apparatus 101 depicted in FIG. 1A can be applied to any among various types of apparatuses that execute processes based on signal distortion caused by an amplifier without limitation of the apparatus to the distortion correcting apparatus 210.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A calculating apparatus comprising:
   a first state variable calculating unit that calculates first state variables respectively having a memory effect and being of an amplifier that causes signal distortion;
   an amplifier model unit that based on the calculated first state variables, calculates the signal distortion caused by the amplifier, as a distortion characteristic; and
   an output unit that outputs the calculated distortion characteristic,
   wherein the first state variable calculating unit includes:
      an estimated temperature calculating unit that calculates a junction temperature of the amplifier;
      a gate lag model calculating unit that calculates a gate lag of the amplifier;
      a drain lag model calculating unit that calculates a drain lag of the amplifier;
      a gate bias voltage model calculating unit that calculates a gate bias voltage of the amplifier; and
      a drain bias voltage model calculating unit that calculates a drain bias voltage of the amplifier.

2. The calculating apparatus according to claim 1, wherein the first state variable calculating unit calculates at least one of the first state variables based on a signal input to the amplifier.

3. The calculating apparatus according to claim 2, wherein the first state variable calculating unit calculates at least one of the first state variables based on an envelope of or amplitude of the signal input to the amplifier.

4. The calculating apparatus according to claim 1, wherein the first state variable calculating unit calculates a first state variable, based on a second state variable that is different from the first state variable.

5. The calculating apparatus according to claim 1, further comprising
   a second state variable calculating unit that calculates second state variables respectively having no memory effect and being of the amplifier, wherein
   the first state variable calculating unit calculates at least one of the first state variables, based on a second state variable calculated by the second state variable calculating unit.

6. The calculating apparatus according to claim 1, wherein the amplifier model unit calculates the distortion characteristic, based on the signal input to the amplifier and the first state variables.

7. The calculating apparatus according to claim 1 further comprising
   a second state variable calculating unit that calculates second state variables respectively having no memory effect and being of the amplifier, wherein
   the amplifier model unit calculates the distortion characteristic, based on the first state variables and the second state variables.

8. The calculating apparatus according to claim 1, wherein the first state variable calculating unit calculates the first state variables, including a non-linear state variable.

9. A distortion correcting apparatus comprising:
the calculating apparatus according to claim 1;
a correction coefficient calculating unit that based on the distortion characteristic calculated by the amplifier model unit, calculates correction coefficients; and
a correcting unit that based on the correction coefficient calculated by the correction coefficient calculating unit, corrects a signal input to the amplifier.

10. An amplifying apparatus comprising:
an amplifier that amplifies a signal;
the calculating apparatus according to claim 1;
a correction coefficient calculating unit that calculates correction coefficients, based on the distortion characteristic calculated by the amplifier model unit; and
a correcting unit that corrects the signal input to the amplifier, based on the correction coefficient calculated by the correction coefficient calculating unit.

11. The amplifying apparatus according to claim 10, further comprising:
a feedback system that feeds back the signal amplified by the amplifier; and
an updating unit that updates parameters, based on the signal fed back by the feedback system, wherein
at least one among the state variable calculating unit and the amplifier model unit calculates based on the parameters updated by the updating unit.

12. A calculating method comprising:
calculating first state variables respectively having a memory effect and being of an amplifier that causes signal distortion;
calculating as a distortion characteristic and based on the calculated first state variables, the signal distortion caused by the amplifier; and
outputting the calculated distortion characteristic,
wherein calculating first state variable includes:
    calculating a junction temperature of the amplifier;
    calculating a gate lag of the amplifier;
    calculating a drain lag of the amplifier;
    calculating a gate bias voltage of the amplifier; and
    calculating a drain bias voltage of the amplifier.

13. A distortion correcting method comprising:
the calculating apparatus according to claim 12;
calculating correction coefficients, based on the calculated distortion characteristic; and
correcting based on the calculated correction coefficient, a signal input to the amplifier.

14. An amplifying method comprising:
amplifying a signal by an amplifier;
the calculating apparatus according to claim 12;
calculating correction coefficients, based on the calculated distortion characteristic; and
correcting based on the calculated correction coefficients, the signal input to the amplifier.

* * * * *